(12) United States Patent
Shih et al.

(10) Patent No.: US 7,368,782 B2
(45) Date of Patent: May 6, 2008

(54) DUAL-BIT NON-VOLATILE MEMORY CELL AND METHOD OF MAKING THE SAME

(75) Inventors: Ping-Chia Shih, Hsin-Chu (TW); Shou-Wei Hsieh, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 27 days.

(21) Appl. No.: 11/306,737

(22) Filed: Jan. 9, 2006

(65) Prior Publication Data

US 2006/0199356 A1    Sep. 7, 2006

Related U.S. Application Data

(62) Division of application No. 10/711,197, filed on Sep. 1, 2004, now Pat. No. 7,071,063.

(51) Int. Cl.
*H01L 27/12* (2006.01)

(52) U.S. Cl. .................. 257/324; 257/314; 257/326; 257/637

(58) Field of Classification Search .............. 257/300, 257/324, 314, 326, 637; 438/467, 288, 589, 438/197

See application file for complete search history.

(56) References Cited

U.S. PATENT DOCUMENTS

| | | | |
|---|---|---|---|
| 5,468,663 A * | 11/1995 | Bertin et al. .............. 438/259 |
| 6,713,333 B2 * | 3/2004 | Mayuzumi .................. 438/197 |
| 6,893,917 B2 | 5/2005 | Hsieh |
| 2003/0122185 A1 | 7/2003 | Wang et al. |
| 2004/0171243 A1 | 9/2004 | Lee et al. |
| 2005/0051836 A1 | 3/2005 | Choi et al. |
| 2005/0054167 A1 | 3/2005 | Choi et al. |
| 2005/0142758 A1 | 6/2005 | Jung |

* cited by examiner

*Primary Examiner*—Zandra V. Smith
*Assistant Examiner*—Tsz Chiu
(74) *Attorney, Agent, or Firm*—Winston Hsu

(57) ABSTRACT

A non-volatile memory cell having a local silicon nitride layer to control dispersion of hot electrons is disclosed. The dual-bit non-volatile memory cell has a stack of layers including silicon on the surface of a substrate. The stack of layers has at least one first oxide silicon layer and a silicon nitride layer overlying the first oxide silicon layer. An opening is formed in the stack of layers and a gate oxide layer is deposited on the surface of the substrate within the opening. A control gate is formed on the gate oxide layer followed by a second oxide silicon layer overlying the surfaces of the control gate and the stack of layers. A second polysilicon layer is formed overlying the gate oxide layer. Dual split-gates are then formed on the second polysilicon layer.

3 Claims, 12 Drawing Sheets

DUAL-BIT NON-VOLATILE MEMORY CELL AND METHOD OF MAKING THE SAME

CROSS REFERENCE TO RELATED APPLICATIONS

This is a divisional application of U.S. patent application Ser. No. 10/711,197 filed Sep. 1, 2004, now U.S. Pat. No. 7,071,063 by Ping-Chia Shih and Shou-Wei Hsieh.

BACKGROUND OF THE INVENTION

1. Field of the Invention

The invention relates to a non-volatile memory cell and method of making the same. More particularly, the invention relates to a dual-bit non-volatile memory cell having a local silicon nitride layer, and method of making the same.

2. Description of the Prior Art

Non-volatile memory cells are widely used because they can store data even when no power exists. At present, a non-volatile memory cell can be sub-classified into a floating-gate structure and a silicon-oxide-nitride-oxide-silicon (SONOS) structure. The floating-gate structure uses source-side injection (SSI) or tunneling effect, leading to hot electrons stored in the floating gate. However, the application of the floating-gate structure is increasingly difficult day after day because of the hot electrons punching through along the select gate channel when the source-drain channel length is too short. The SONOS structure uses the SSI effect, leading to hot electrons stored in a silicon nitride layer. Hence, the SONOS structure can be manufactured smaller in size than the floating-gate structure. Therefore, there is a tendency today for the SONOS structure to replace the floating-gate structure.

Please refer to FIG. 1 to FIG. 3, which show the manufacturing method schematics according to the SONOS structure of the prior art. As shown in FIG. 1, a gate oxide layer 120 on the surface of a substrate 110 is provided. A control gate 130 is formed using a first polysilicon layer (not shown) on the gate oxide layer 120. As shown in FIG. 2, a first oxide silicon layer 141 is formed on the surfaces of the control gate 130, the gate oxide layer 120, and the substrate 110. A silicon nitride layer 142 overlying the first oxide silicon layer 141 is formed next. Then a second oxide silicon layer 143 overlying the silicon nitride layer 142 is formed. Finally, a second polysilicon layer 150 is deposited overlying the second oxide silicon layer 143. As shown in FIG. 3, a self-align etching process is performed to anisotropic etch the second polysilicon layer 150 to form dual split-gates 151,152 on the second oxide silicon layer 143. The dual split-gates 151,152 are separated from the control gate 130 by the second oxide silicon layer 143, the silicon nitride layer 142, and the first oxide silicon layer 141.

General speaking, the SONOS structure of the prior art cannot make hot electrons effectively locally inject into and remain stored in the bottom of the silicon nitride layer 142, where the bottom of the silicon nitride layer 142 is defined as the portions of the silicon nitride layer 142 shown in FIG. 3 disposed parallel to the surface of the substrate 110. This is because the bottom of the silicon nitride layer 142 and the portions of the silicon nitride layer 142 near the two vertical sidewalls of the control gate 130 both accept the electrons according to Gaussian distribution when an external electric field is applied. Hence, the hot electrons of the SONOS structure of the prior art are stored dispersedly in the silicon nitride layer 142 set on the surface near the two vertical sidewalls of the control gate 130, reducing the storage ability of the SONOS structure.

SUMMARY OF THE INVENTION

It is therefore a primary object of the claimed invention to provide a local silicon nitride layer to prevent the hot electrons storing dispersedly near the two vertical sidewalls of the control gate.

According to the claimed invention, a non-volatile memory cell and method of making the same are presented using a local silicon nitride layer. The dual-bit non-volatile memory cell has a stack of layers including silicon on the surface of a substrate. The stack of layers has at least one first oxide silicon layer and a silicon nitride layer overlying the first oxide silicon layer. An opening is formed in the stack of layers and a gate oxide layer is deposited on the surface of the substrate within the opening. A control gate is formed on the gate oxide layer followed by a second oxide silicon layer overlying the surfaces of the control gate and the stack of layers. A second polysilicon layer is formed overlying the gate oxide layer. Dual split-gates are then formed on the second polysilicon layer.

It is an advantage of the present invention that hot electrons can effectively locally inject into and be stored in the silicon nitride layer substantially parallel with the substrate. The present invention uses a local silicon nitride layer to prevent the hot electrons from being stored dispersedly in the silicon nitride layer near the two vertical sidewalls of the control gate.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
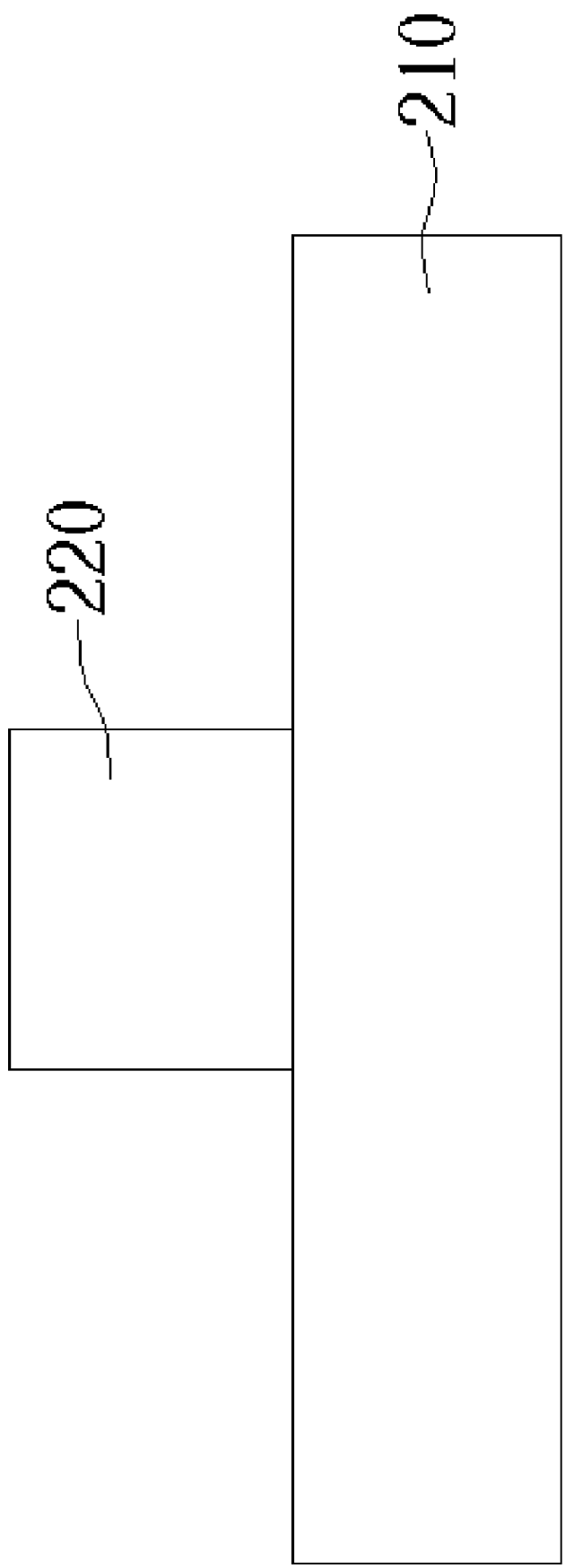
FIG. 4 to FIG. 12 show the method schematics according to a SONOS memory cell according to the present invention.

Please refer to FIG. 4 to FIG. 12, which show the method schematics according to the SONOS memory cell of an embodiment of the present invention. As shown in FIG. 4, a dummy gate 220, having an upper surface and two sidewalls, on a substrate 210 is formed. Although not shown, the substrate would further comprise a drain region and a source region with each of the regions set separately on opposing sides of the dummy gate 220. The dummy gate 220 could be formed using the same mask used for forming the control gate 261 shown in FIGS. 11-12 so that an extra mask is not required. The dummy gate 220 could be made from silicon dioxide.

Figure 5:
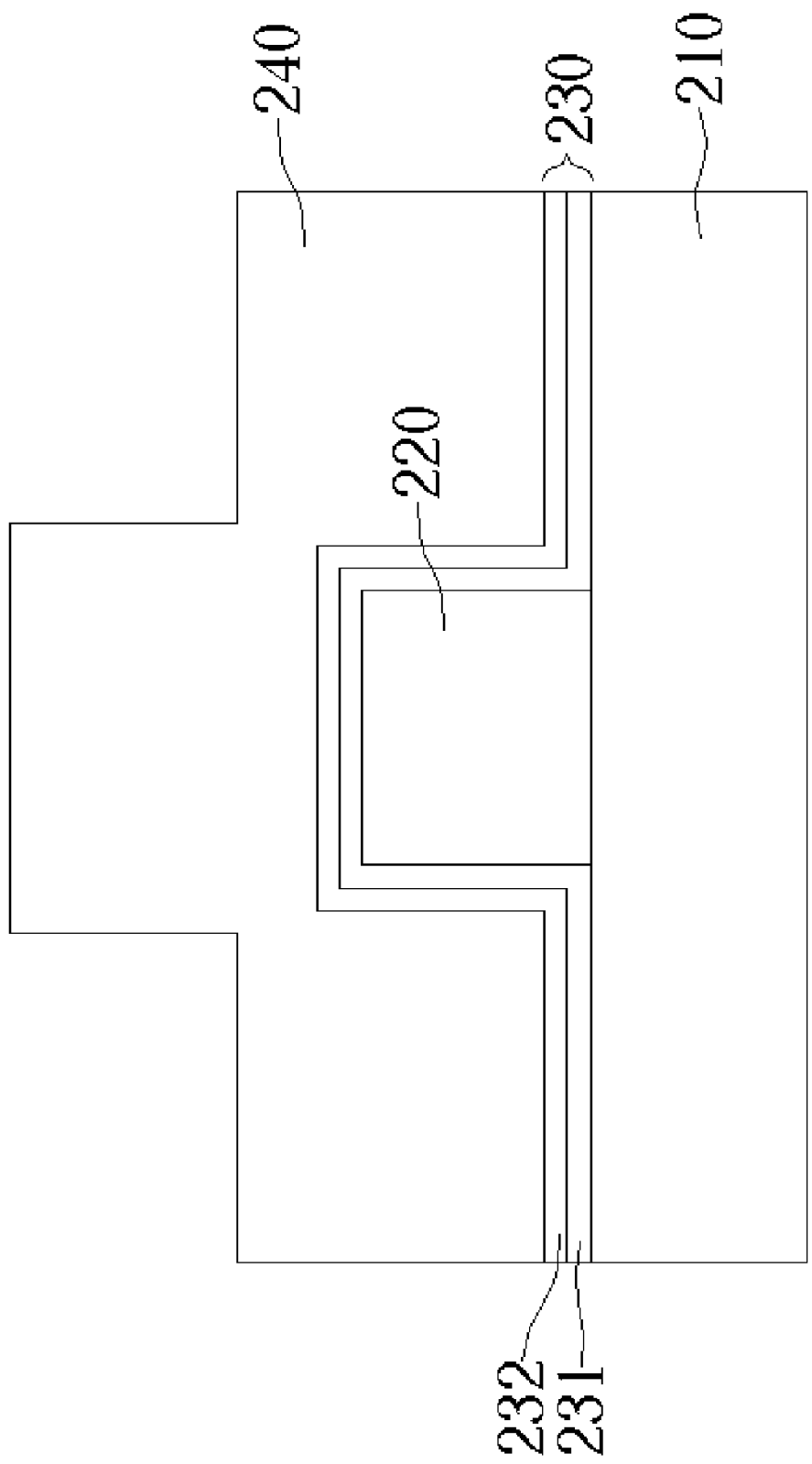

Next, as shown in FIG. 5, a stack of layers 230, having at least an oxide silicon layer 231 and a silicon nitride layer 232 overlying the silicon oxide layer 231, are formed on the exposed portion of the substrate 210 and the upper surface and the two sidewalls of the dummy gate 220. A dummy oxide 240 overlying the stack of layers 230 is then formed.

Figure 6:
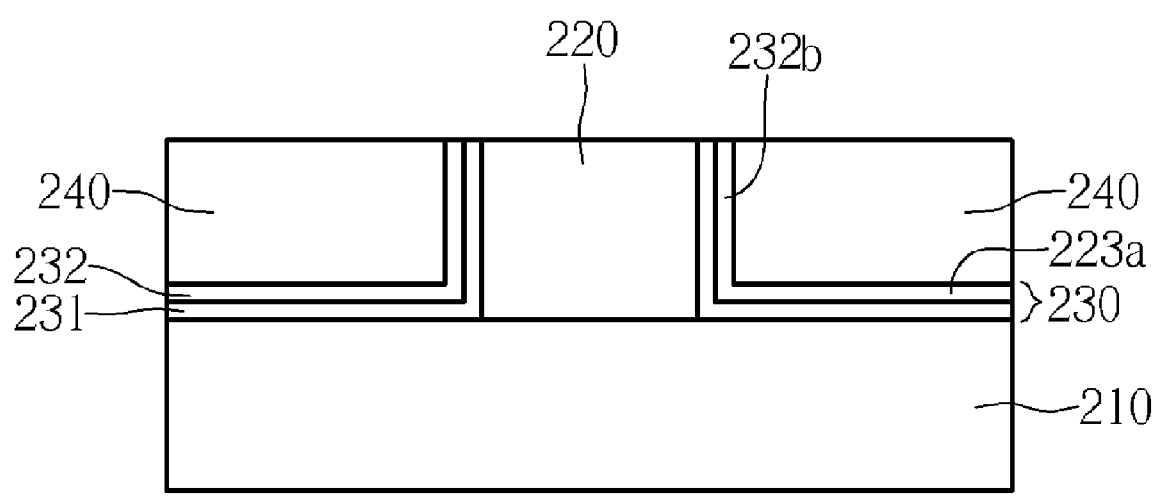

Next, as shown in FIG. 6, respective portions of the dummy oxide 240, the stack of layers 230, and the dummy gate 220 are removed to arrive at a predetermined height by chemical mechanical polishing (CMP) or etching back. At this phase, the remaining silicon nitride layer 232 is L shaped. The L shaped silicon nitride layer 232 includes a horizontal segment 232a and a vertical segment 232b.

Figure 7:
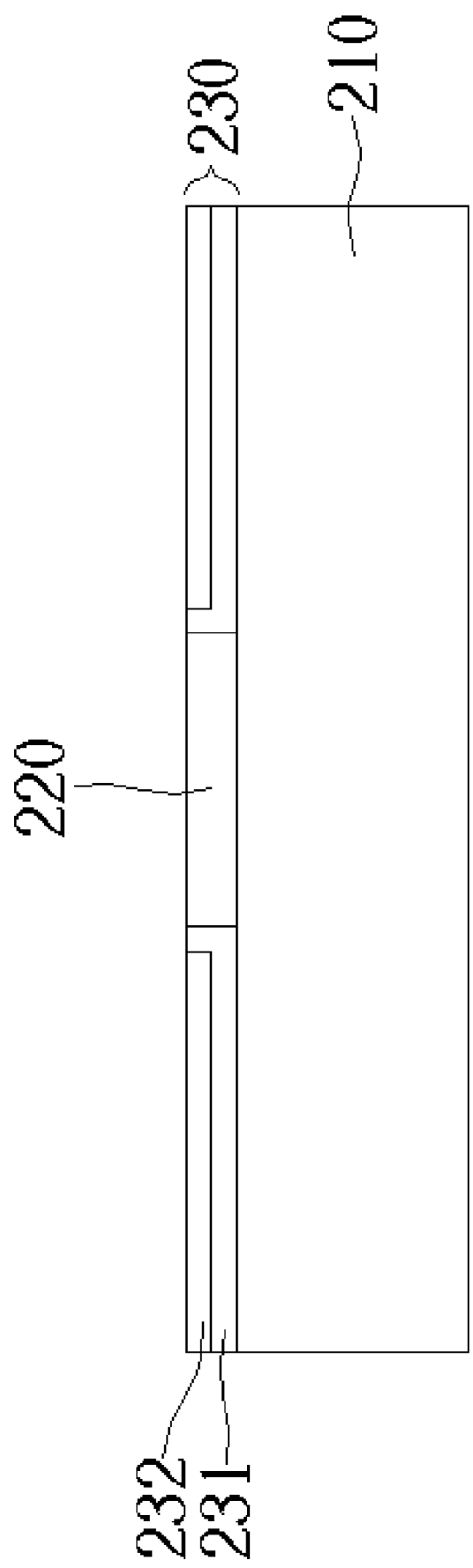

Next, as shown in FIG. 7, a portion of the dummy oxide 240, a portion of the stack of layers 230 on the surface of the two sidewalls of the dummy gate 220, and a portion of the dummy gate 220 are dry etched using the horizontal segment 232a of the silicon nitride layer 232 as a stop layer. It is to be understood that the vertical segment 232b of the L shaped silicon nitride layer 232 may not be completely etched away, but this is not explicitly shown in this figure.

Figure 8:
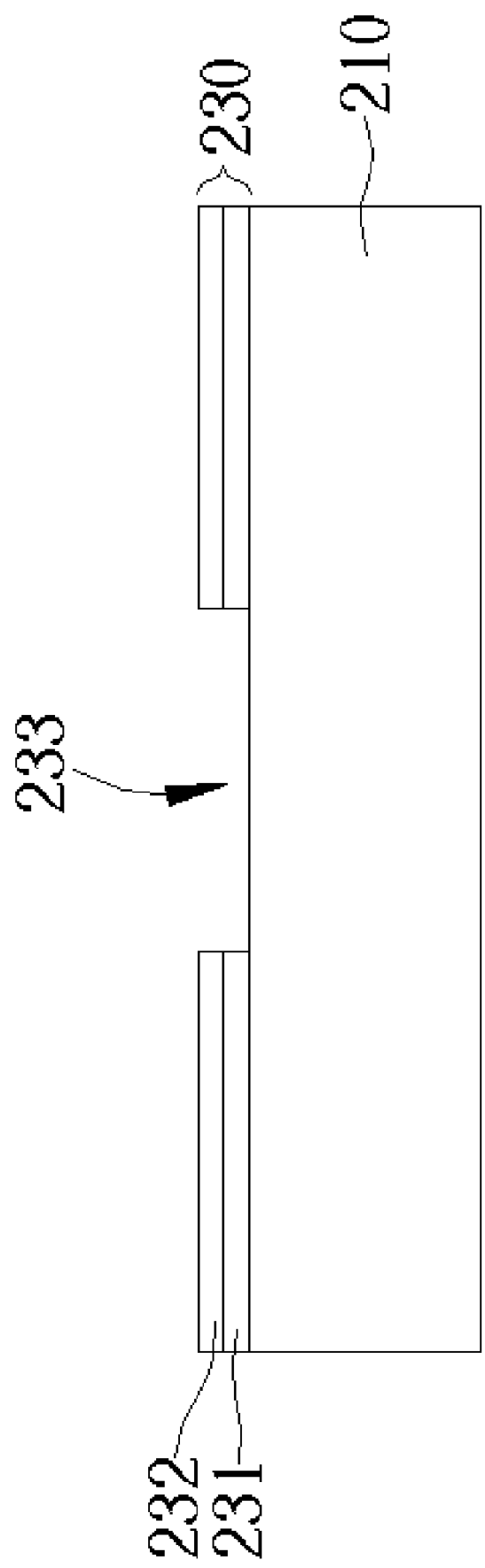

The dummy gate 220 is removed fully such that the stack of layers 230 has a first opening 233 exposing a portion of the substrate 210 as depicted in FIG. 8. The dummy gate 220 may be removed by using conventional wet etch method such as diluted HF. The wet etch also slightly etch away a portion of the silicon oxide layer 231 that was adjacent to the dummy gate 220.

Figure 9:
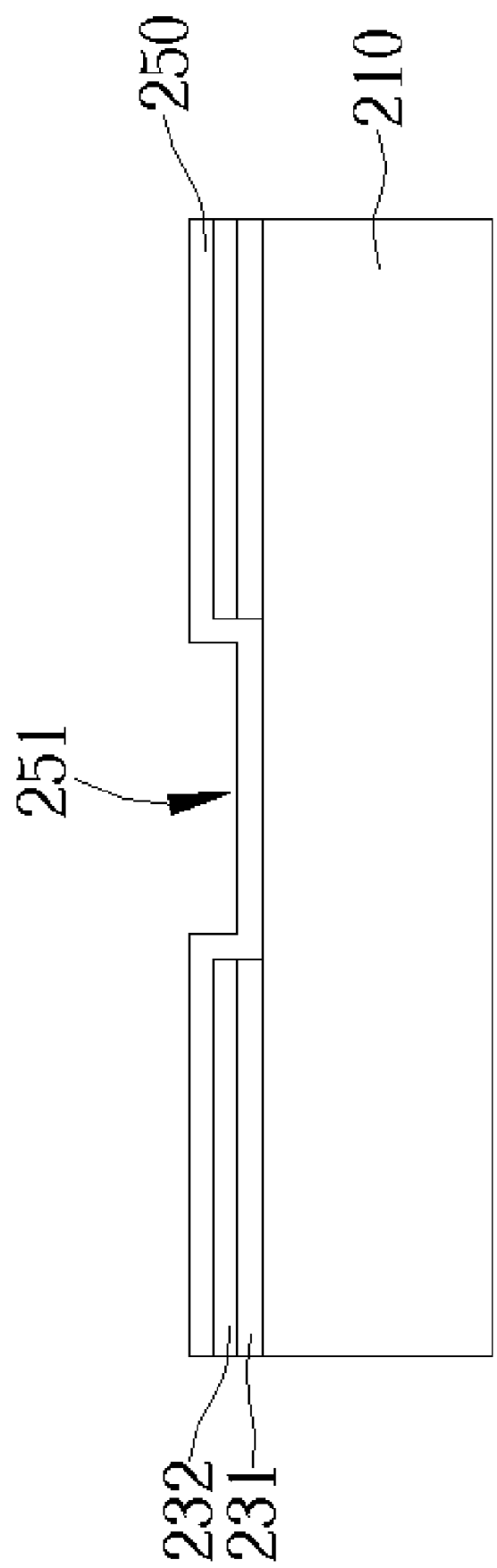

As shown in FIG. 9, a gate oxide layer 250 is formed on the first opening 233, on the stack of layers 230 and the exposed silicon nitride layer 232 such that the gate oxide layer 250 has a recess 251. Although it may not be required to do so without departing from the spirit of the invention, it is preferred that portions of the gate oxide layer 250 outside of the recess 251 be removed or possibly never formed.

Figure 10:
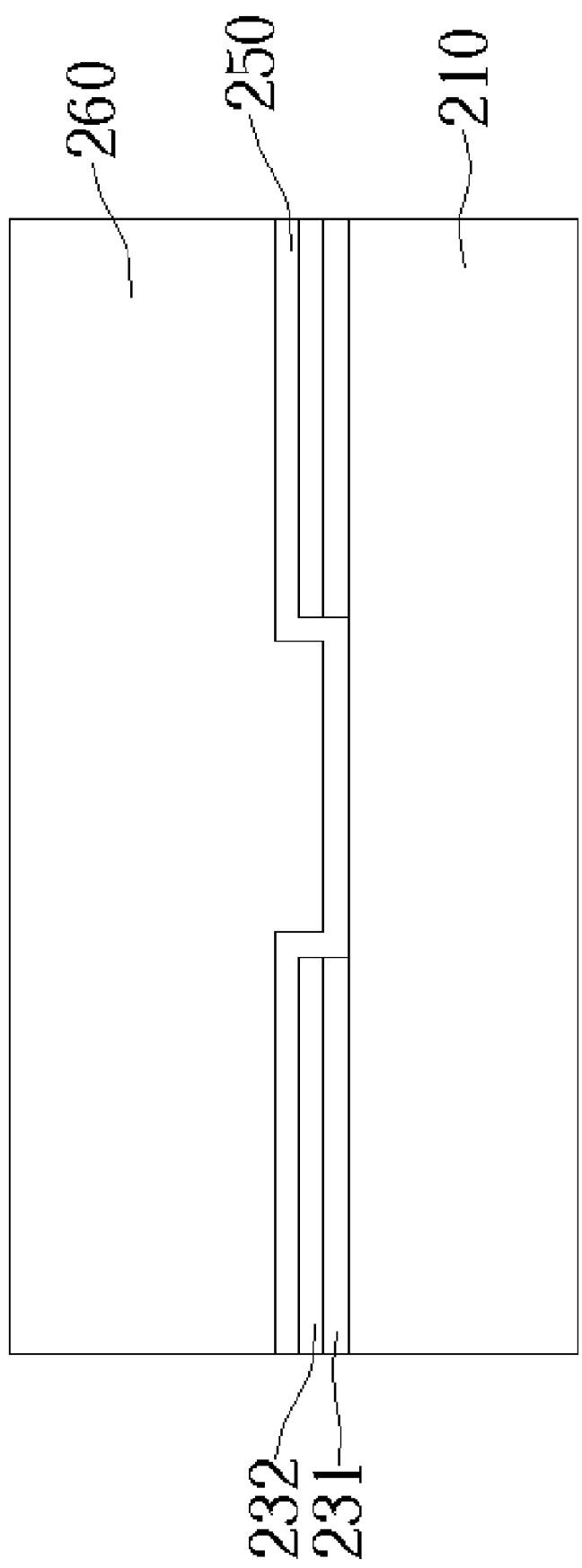
Figure 11:
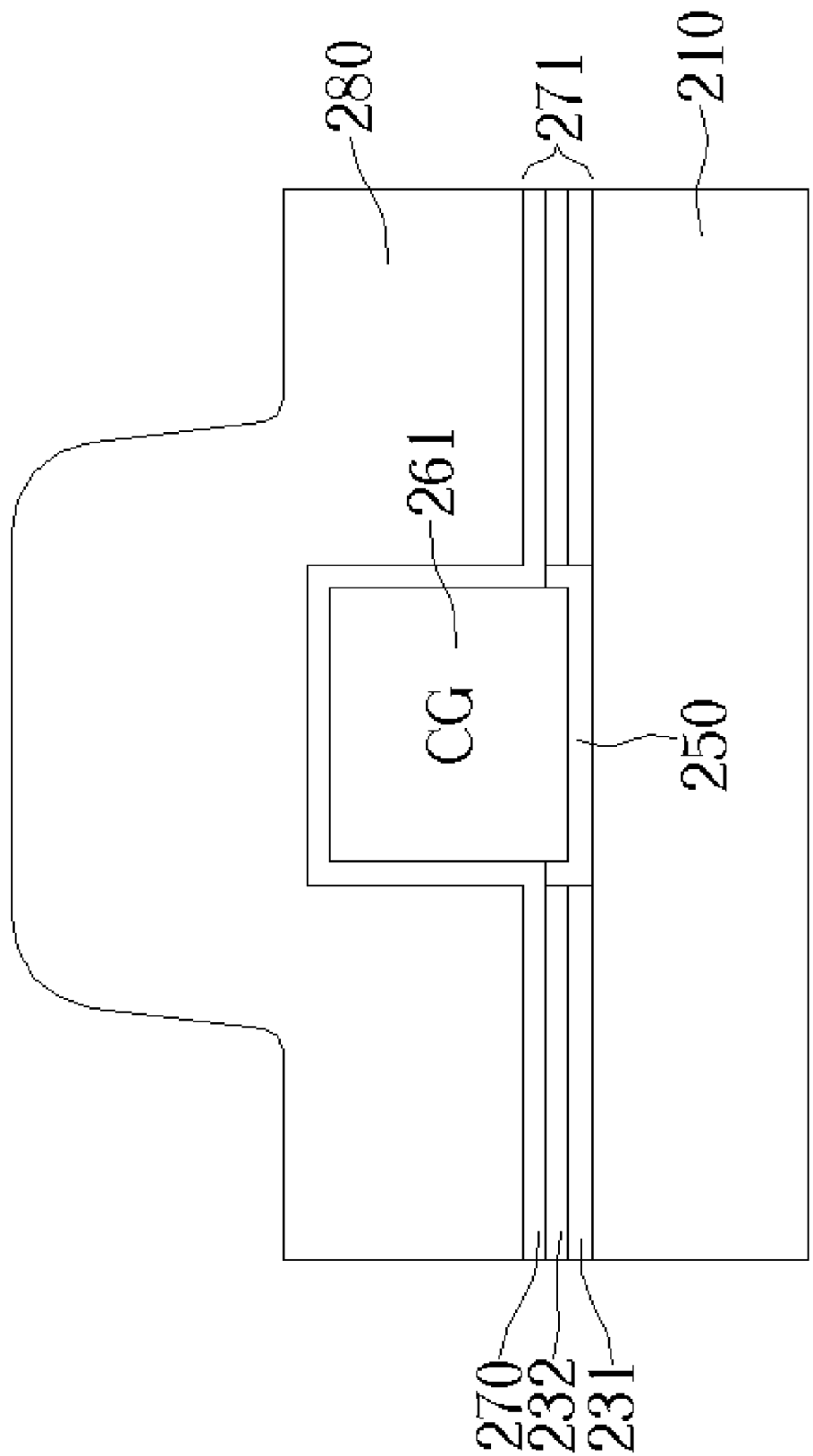

Next, as shown in FIG. 10, a first polysilicon layer 260 is formed on the gate oxide layer 250. The first polysilicon layer 260 fills the recess 251.

Figure 1:
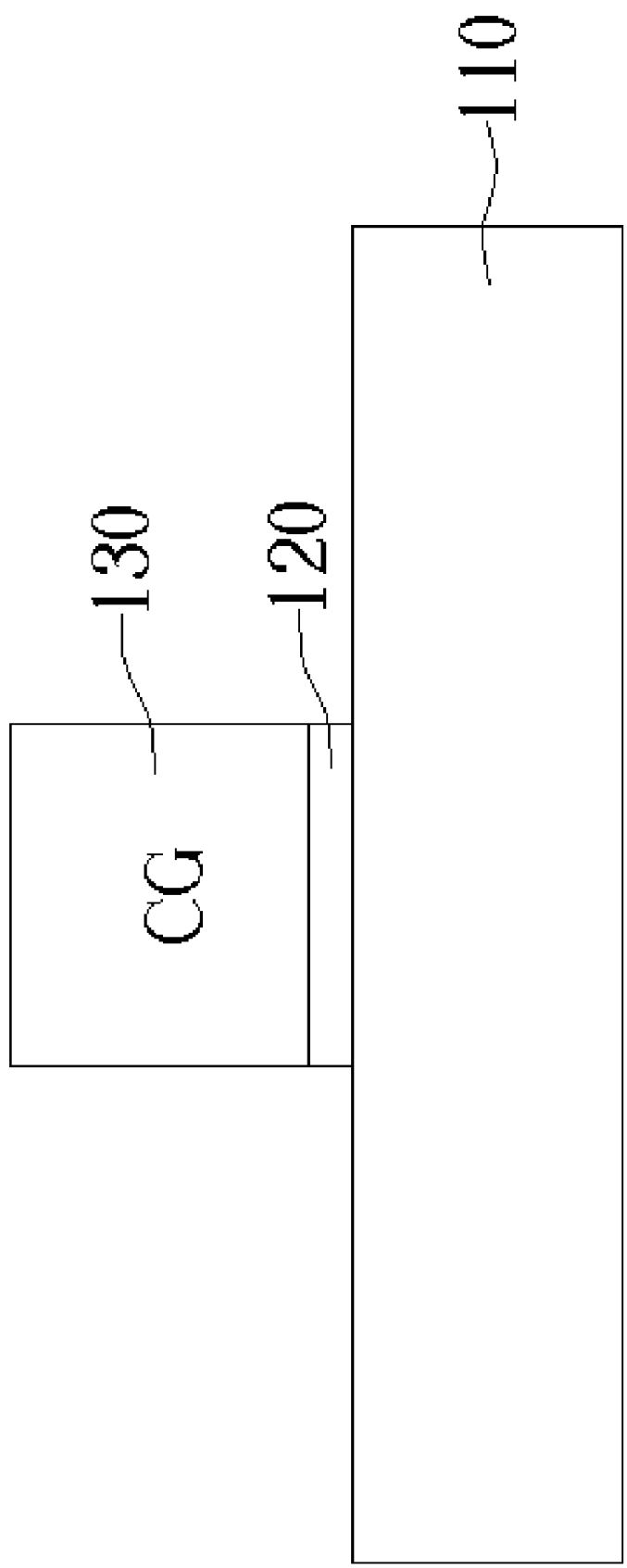
FIG. 1 to FIG. 3 show the method schematics according to a SONOS memory cell of the prior art.
Figure 2:
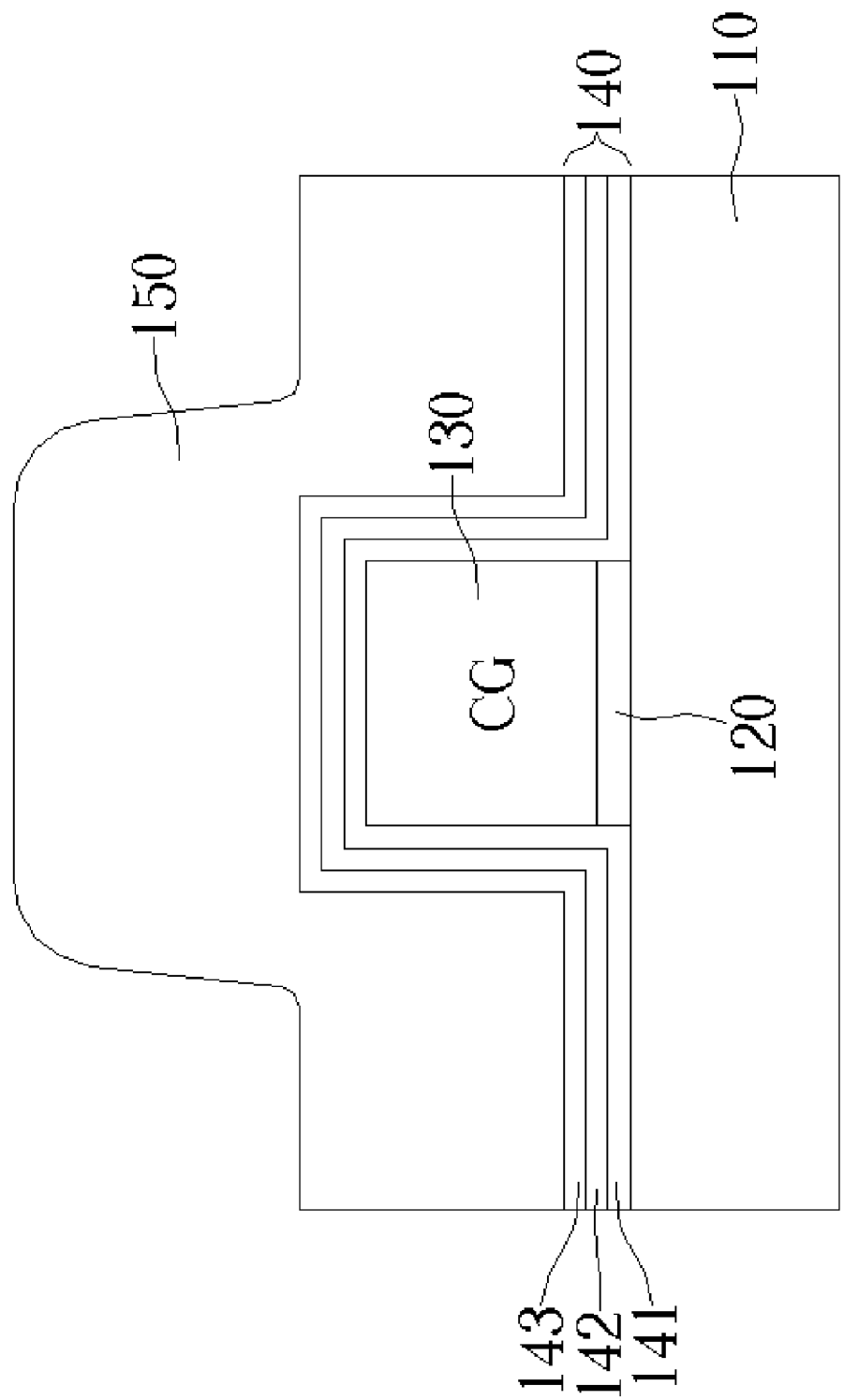
Figure 3:
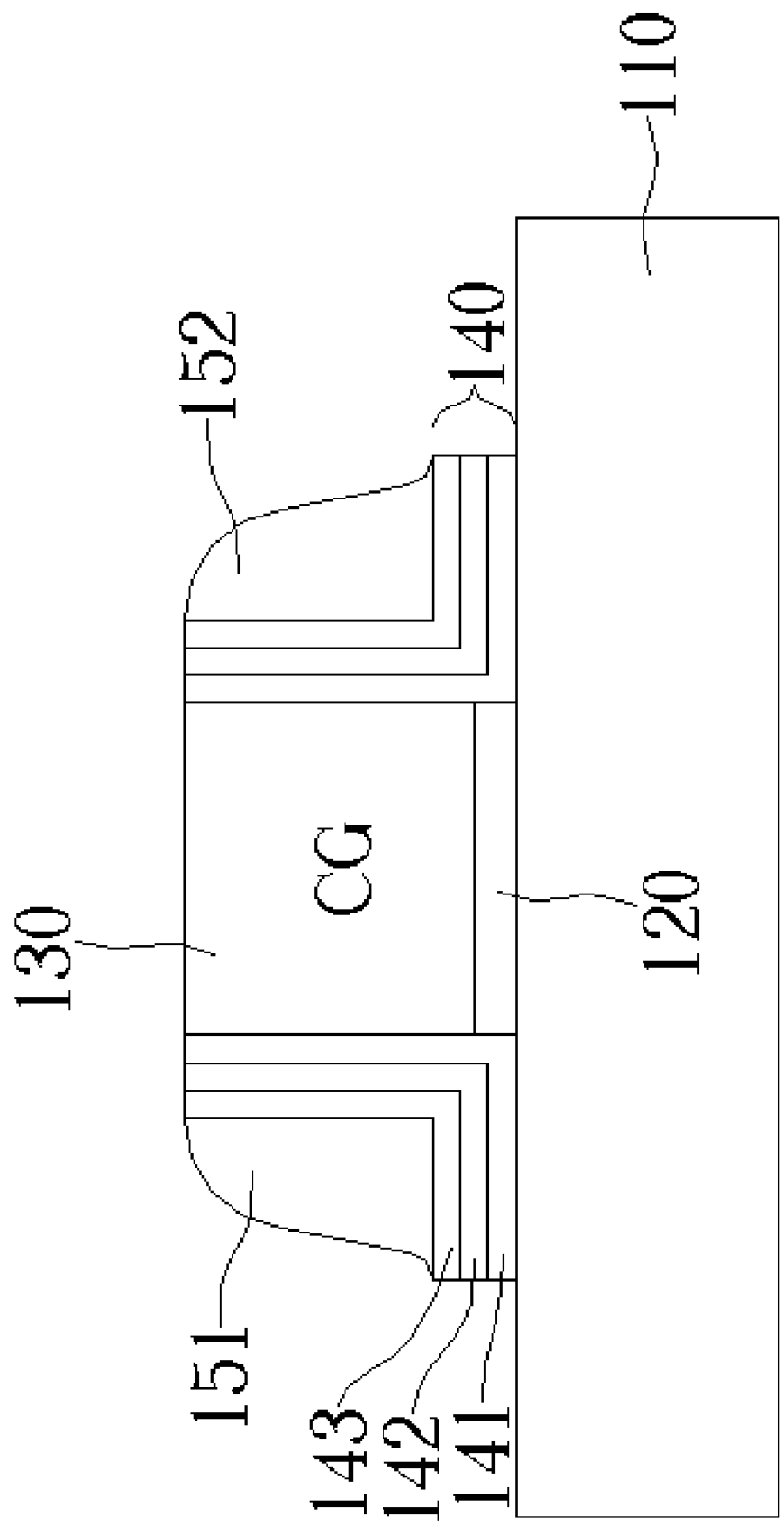

As shown in FIG. 1, a conventional lithography and etching processes are carried out to define the first polysilicon layer 260. A control gate (CG) 261 is formed on the recess 251 using the first polysilicon layer 260. When etching the first polysilicon layer 260 to form the control gate 261, the gate oxide layer positioned directly above the stack of layers 230 is also removed. A second oxide silicon layer 270 is next formed on the surface of the control gate 261 and the stack of the layers 230. Then, an ONO layer 271 is formed with the silicon oxide layer 231, the silicon nitride layer 232, and the second oxide silicon layer 270. A second polysilicon layer 280 on the second oxide silicon layer 270 is formed.

Figure 12:
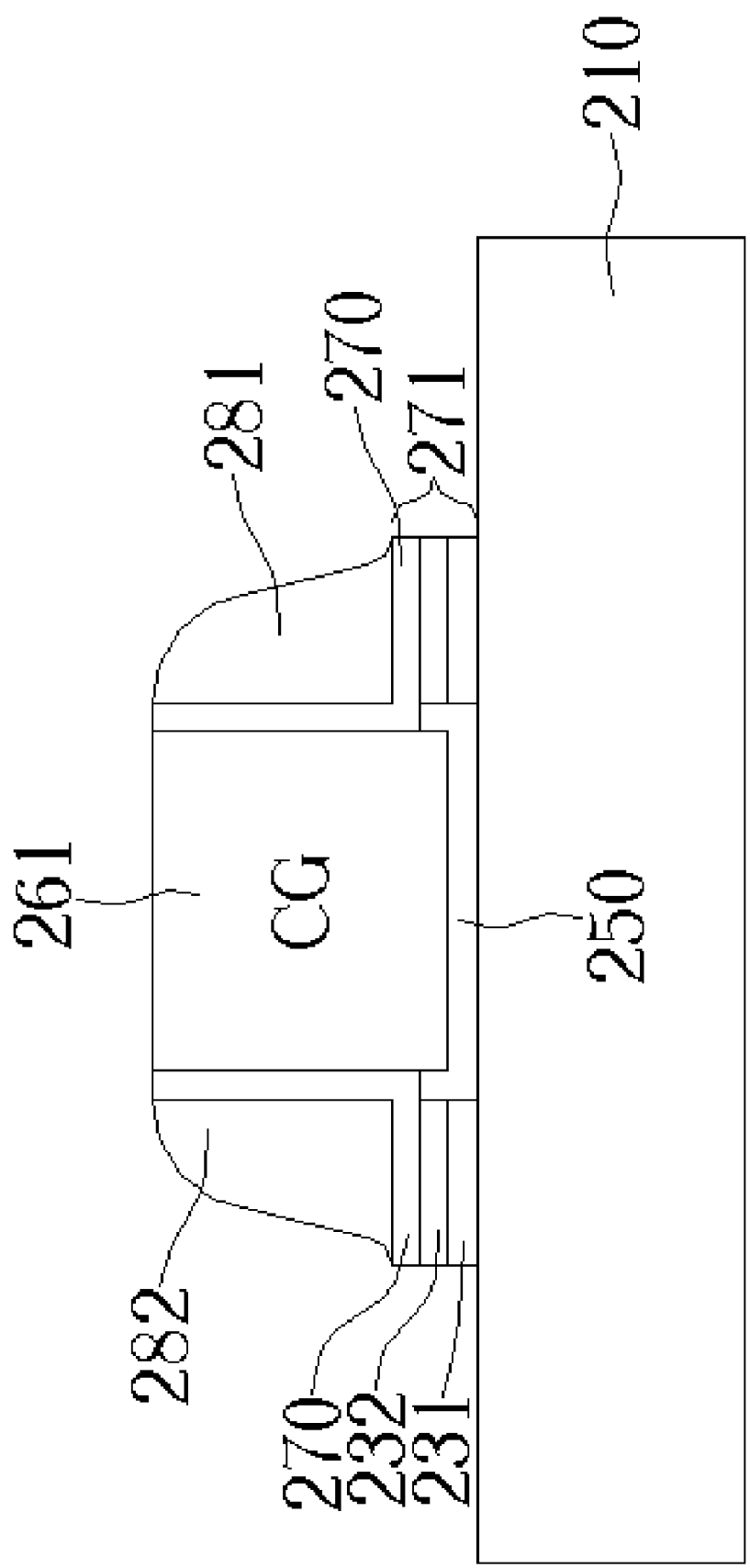

Next, as shown in FIG. 12, a self-aligned etching is performed, anisotropically etching the second polysilicon layer 280 to form dual split-gates 281,282 on the second oxide silicon layer 270, separated from the control gate 261 by the second oxide silicon layer 270. Subsequently, an ion implantation may be performed to form source/drain regions (not shown) in the substrate 110.

Compared with a SONOS memory cell of the prior art, the hot electrons of the SONOS memory cell of the present invention can effectively locally inject into and be stored away from the vertical sidewalls of the control gate in the of the silicon nitride layer of the dual-bit non-volatile memory cell. Therefore, the present invention solves the prior art problem of the hot electrons being stored dispersedly in the silicon nitride layer near the two vertical sidewalls of the control gate, increasing the storage ability of the memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A. dual-bit non-volatile memory cell, comprising:
a gate oxide layer on a surface of the substrate, the gate oxide layer having upwardly protruding segments and a bottom segment between the upwardly protruding segments, wherein the upwardly protruding segments and the bottom segment constitute a recess area of the gate oxide layer;
a control gate inlaid into the recess area of the gate oxide layer;
a composite dielectric layer being parallel to the surface of the substrate and being adjacent to the protruding segments of the gate oxide layer, the composite dielectric layer comprising a nitride segment, wherein the nitride segment is only in parallel the surface of the substrate and substantially does not extend upwardly along a sidewall of the control gate;
an L-shaped liner layer having a vertical segment and a horizontal segment, the vertical segment directly bordering vertical sidewalls of the control gate, the horizontal segment of the L-shaped liner layer directly covering the nitride segment and the upwardly protruding segments of the gate oxide layer; and
a split-gate on the L-shaped liner layer.

2. The dual-bit non-volatile memory cell of claim 1 wherein the L-shaped liner layer is made of silicon oxide.

3. The dual-bit non-volatile memory cell of claim 1 wherein the nitride segment borders the upwardly protruding segments of the gate oxide layer.

* * * * *